United States Patent
Kostylev et al.

(10) Patent No.: US 6,992,369 B2
(45) Date of Patent: Jan. 31, 2006

(54) PROGRAMMABLE RESISTANCE MEMORY ELEMENT WITH THRESHOLD SWITCHING MATERIAL

(75) Inventors: Sergey A. Kostylev, Bloomfield Hills, MI (US); Wolodymyr Czubatyj, Warren, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 10/681,781

(22) Filed: Oct. 8, 2003

(65) Prior Publication Data
US 2005/0077515 A1    Apr. 14, 2005

(51) Int. Cl.
*H01L 29/86* (2006.01)

(52) U.S. Cl. .................. 257/537; 257/2; 257/3

(58) Field of Classification Search .............. 257/2, 257/3, 537
See application file for complete search history.

(56) References Cited

U.S. PATENT DOCUMENTS

| | | | |
|---|---|---|---|
| 6,236,059 B1 * | 5/2001 | Wolstenholme et al. | 257/3 |
| 6,635,914 B2 * | 10/2003 | Kozicki et al. | 257/296 |
| 6,795,338 B2 * | 9/2004 | Parkinson et al. | 365/163 |
| 2004/0026730 A1 * | 2/2004 | Kostylev et al. | 257/314 |

* cited by examiner

*Primary Examiner*—Jerome Jackson
(74) *Attorney, Agent, or Firm*—Philip H. Schlazer; Marvin S. Siskind

(57) ABSTRACT

A programmable resistance memory element comprising a dielectric material between a programmable resistance memory material and a threshold switching material.

7 Claims, 6 Drawing Sheets

US 6,992,369 B2

PROGRAMMABLE RESISTANCE MEMORY ELEMENT WITH THRESHOLD SWITCHING MATERIAL

FIELD OF THE INVENTION

The present invention relates generally to electrically programmable phase-change memory. More specifically, the present invention relates to an electrically programmable phase change memory that includes a threshold switching material.

BACKGROUND OF THE INVENTION

The use of electrically programmable phase-change materials (for example, materials which can be electrically programmed between amorphous and crystalline states) for electronic memory applications is well known in the art and is disclosed, for example, in commonly assigned U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Still another example of a phase-change memory element is provided in commonly assigned U.S. patent application Ser. No. 09/276,273, the disclosure of which is incorporated by reference herein.

Generally, phase-change materials are capable of being electrically programmed between a first structural state where the material is generally amorphous and a second structural state where the material is generally crystalline. The term "amorphous", as used herein, refers to a condition which is relatively structurally less ordered or more disordered than a single crystal. The term "crystalline", as used herein, refers to a condition which is relatively structurally more ordered than amorphous. The phase-change material exhibits different electrical characteristics depending upon its state. For instance, in its crystalline, more ordered state the material exhibits a lower electrical resistivity than in its amorphous, less ordered state.

Materials that may be used as a phase-change material include alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy is the alloy $Ge_2Sb_2Te_5$.

FIG. 1 is an example of a plot of the resistance of a volume chalcogenide phase-change memory material versus the amplitude of a current pulse through the memory material. Referring to FIG. 1, several different programming regimes can be distinguished. In the left side of the curve, the resistance of the memory material remains substantially constant (i.e., in its high resistance or RESET state) until a current pulse of sufficient energy is applied. The memory material is then transformed from its high resistance (RESET) state to its low resistance (SET) state. The current pulse sufficient to program the memory material from the high resistance state to the low resistance state is referred to as a "set pulse". While not wishing to be bound by theory, it is believed that the set pulse is sufficient to change at least a portion of the volume of memory material from a less-ordered amorphous state to a more-ordered crystalline state.

The volume of memory material may be programmed back from the low resistance state or SET state to the high resistance or RESET state by applying a current pulse of sufficient amplitude, referred to as a "reset pulse". While not wishing to be bound by theory, it is believed that application of a reset pulse to the memory material is sufficient to change at least a portion of the volume of memory material from a more-ordered crystalline state to a less-ordered amorphous state. The memory material may be programmed back and forth between the high resistance or RESET state and the low resistance or SET state. This type of programming scheme provides for a binary mode of operation (for example, the RESET state may be a logic 0 while the SET state may be a logic 1).

Referring to the right side of the curve of FIG. 1, as the amplitude of the current through the memory material increases, the resistance of the device increases. This increase is both gradual and reversible. In this regime, the chalcogenide memory material may be programmed to any resistance value within a window of resistance values bounded by the low resistance or SET state and the high resistance or RESET state. More specifically, in this regime along the right side of the curve, the memory element may be programmed from any one of the resistance states on the right side of the resistance curve to any other of the resistance states on the right side of the curve by the application of a current pulse of sufficient amplitude. The memory material may thus be programmed between three or more resistance values within the resistance window so as to provide for multi-state, directly overwritable data storage. While not wishing to be bound by theory, it is believed that each of the resistance states along the right side of the curve may correspond to a particular ratio of the volume of crystalline material to the volume of amorphous material in an active region of the chalcogenide material. Three intermediate resistance states R1, R2 and R3 are shown in the resistance curve of FIG. 1.

SUMMARY OF THE INVENTION

An aspect of the present invention, an electrically programmable memory element, comprising: a programmable resistance material; a threshold switching material; and a first layer of a dielectric material between the programmable resistance material and the threshold switching material.

Another aspect of the invention is a programmable resistance memory element, comprising: a programmable resistance material; a dielectric material formed over the programmable resistance material; and a threshold switching material formed over the dielectric material.

Another aspect of the invention is a programmable resistance memory element, comprising: a threshold switching material; a dielectric material formed over the threshold switching material; and a programmable resistance material formed over the dielectric material.

DETAILED DESCRIPTION OF THE INVENTION

In the following paragraphs and association with the accompanying figures, examples of memory elements formed according to embodiments of the invention are presented. Specific embodiments of the memory elements and methods of making such memory elements are described as they might be implemented for use in semiconductor memory circuits. In interest of clarity, not all features of an actual implementation are described in this specification.

Figure 3:
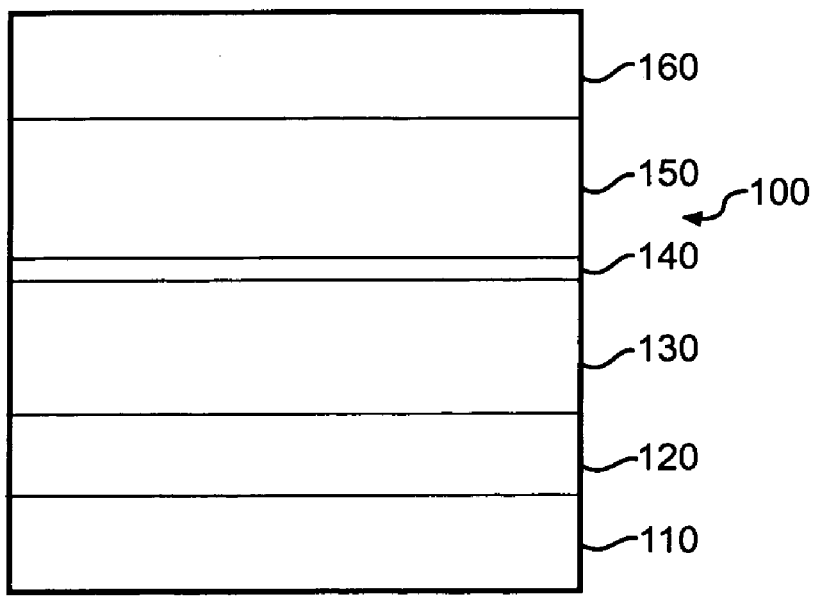
FIG. 3 is an embodiment of a memory element of the present invention including a breakdown layer.

Turning now to the drawings, an embodiment of the present invention is shown in FIG. 3. FIG. 3 shows a memory element 100. A semiconductor substrate 110 is provided. The substrate 110 may include bitlines as well as wordlines used to access the memory element. A layer 120 of a conductive material is formed over the substrate 110. The layer 120 of conductive material forms a first electrode for the memory element (in this case the first electrode is a bottom electrode). The conductive material used for layer 120 may be any conductive material. Examples of conductive materials include titanium-tungsten, tungsten, tungsten silicide, molybdenum, titanium nitride, titanium carbon-nitride, titanium aluminum-nitride, titanium silicon-nitride, and carbon. Other examples of conductive materials include n-type doped polysilicon, p-type doped polysilicon, p-type doped silicon carbon alloys and/or compounds, n-type doped silicon carbon alloys.

A layer 130 of a programmable resistance material is deposited over the layer 120 of conductive material. The programmable resistance material serves as the memory material for the memory element 100. The programmable resistance material includes any material which is electrically programmable between at least a first and a second resistance state. Preferably, the programmable resistance material is chosen to be a phase change material. The phase change material is preferably a chalcogenide alloy that includes at least one chalcogen element. An example of a chalcogenide phase-change material suitable for use as a memory material is the chalcogenide alloy $Ge_2Sb_2Te_5$. The memory material 120 is preferably deposited in its low resistance state. Hence, when the memory material is a chalcogenide phase change material, the chalcogenide alloy is preferably deposited in its crystalline state.

A breakdown layer 140 is then deposited over the memory material 120. Preferably, the breakdown layer 140 shown in FIG. 3 as well as all other breakdown layers described herein are formed of a dielectric material. Examples of dielectric materials which may be used include nitrides (such as silicon nitride) and oxides (such as silicon oxide). It is possible that mixtures of oxides and nitrides may also be used. If two or more breakdown layers are used in an embodiment of a memory element of the present invention, each of the breakdown layers may be formed of the same material or it is possible that different materials may be used for two or more of the breakdown layers.

The breakdown layer 140 as well as all other breakdown layers disclosed herein preferably have a thickness which is less than about 100 Angstroms, more preferably less than about 75 Angstroms, and most preferably less than about 50 Angstroms. In one embodiment of the invention one or more of the breakdown layers may have a thickness between about 20 Angstroms and about 50 Angstroms. If two or more breakdown layers are used, all may have substantially the same thickness, or two or more of the breakdown layers may have different thicknesses.

A layer 150 of a threshold switching material is then deposited over the breakdown layer 140. The threshold switching material used is preferably a chalcogenide threshold switching material. An example of a chalcogenide alloy which may be used as a threshold switching material is the alloy $Si_{14}Te_{39}As_{37}Ge_9X_1$ where X may be element In or the element P.

A layer 160 of a conductive material is deposited over the threshold switching material 150. The layer 160 serves as the second or top electrode of the memory element 100. Generally, any conductive material may be used for layer 160. Examples of conductive materials which may be used for layer 160 include those listed above for layer 120. The conductive materials used for first and second electrodes 120, 160 may be the same materials or different materials.

As noted, the threshold switching material 150 is preferably a chalcogenide threshold switching material. Associated with a chalcogenide threshold switching material is a current-voltage, or "I-V", characteristic curve. The I-V characteristic curve describes the relationship between the current through the threshold switching material as a function of the voltage across the material.

Figure 1:
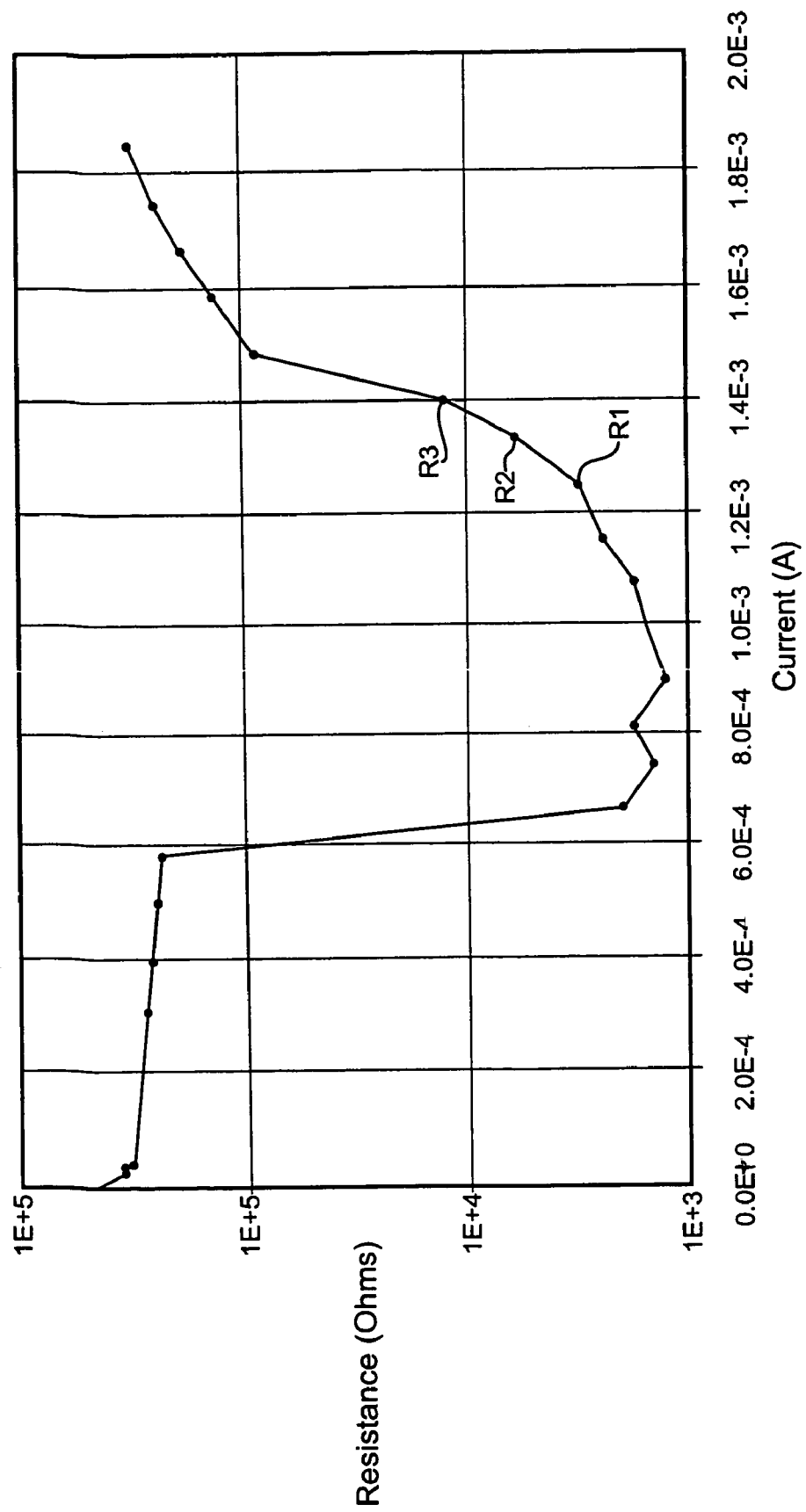
FIG. 1 shows an example of a resistance curve of a volume of chalcogenide memory material.
Figure 2:
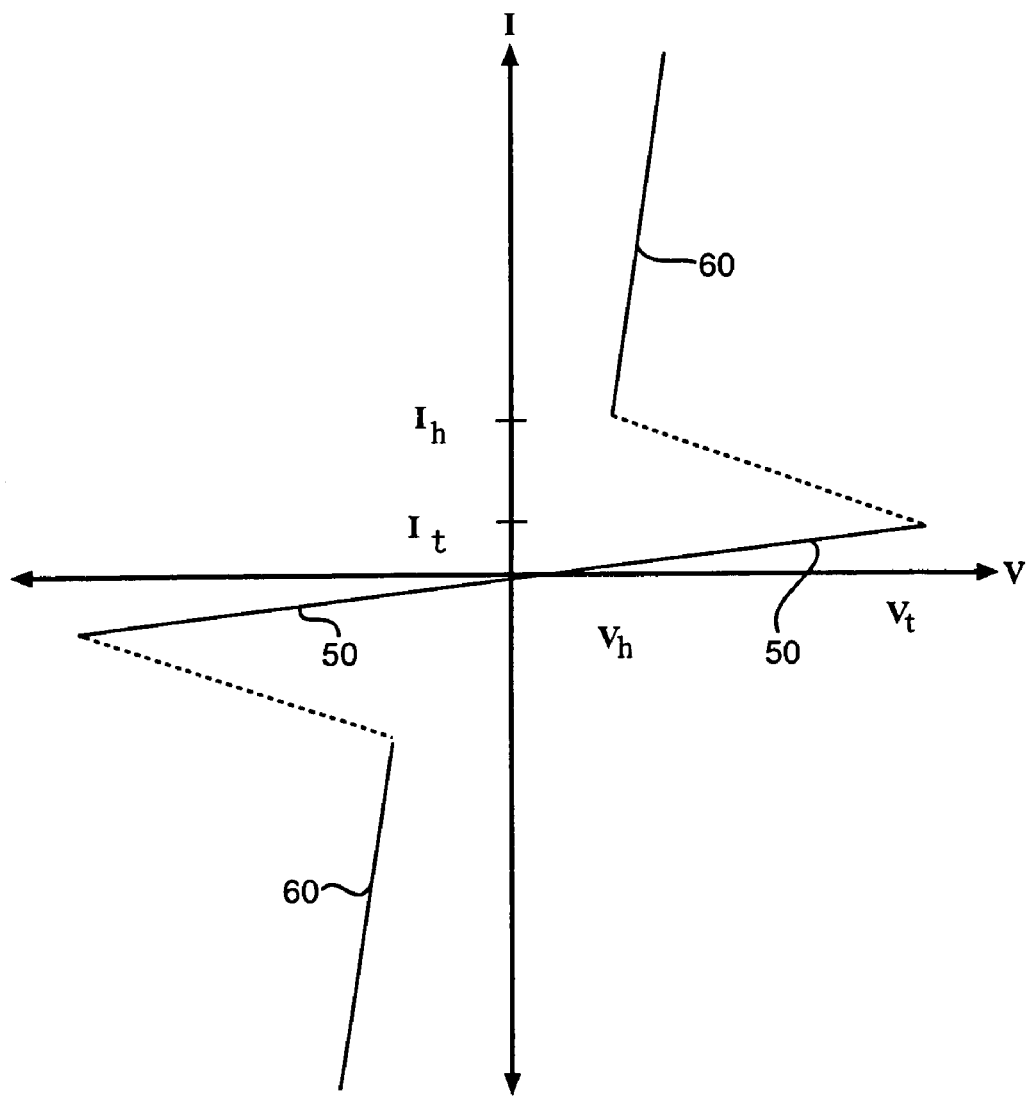
FIG. 2 is an example of a current-voltage characteristic curve for a chalcogenide threshold switching material.

An example of an I-V characteristic curve for a chalcogenide threshold switching material is shown in FIG. 2. FIG. 2 shows the I-V plot in both the first quadrant (where voltages and currents are positive) and the third quadrant (where voltages and currents are negative). While only the first quadrant is described below, an analogous description applies to the curve in the third quadrant of the I-V plot (where the voltage and the current are both negative).

The I-V characteristic curve IV includes an "off-state" branch 50 and an "on-state" branch 60. The off-state branch 50 corresponds to the branch in which the current passing through the threshold switching material increases slightly upon increasing the voltage applied across the threshold material. This branch exhibits a small slope in the I-V plot and appears as a nearly horizontal line in the first (and third) quadrant of FIG. 3. The on-state branch 60 corresponds to the branch in which the current passing through the threshold material increases significantly upon increasing the voltage applied across the threshold material. The magnitude of the slope of the on-state branch is greater than the magnitude of the slope of the off-state branch. In the example shown in FIG. 2, the on-state branch exhibits a large slope in the I-V plot and appears as a substantially vertical line in the first (and third) quadrant of FIG. 2. The slopes of the off-state and on-state branches shown in FIG. 2 are illustrative and not intended to be limiting. Regardless of the actual slopes, the on-state branch exhibits a steeper slope than the off-state branch. When conditions are such that the current through the threshold material and voltage across material is described by a point on the off-state branch of the I-V curve, the threshold material is said to be in the "OFF" state.

Likewise, when conditions are such that the current through the threshold material and voltage across the threshold material is described by a point on the on-state branch of the I-V curve, the threshold material is said to be in the "ON" state.

The switching properties of the threshold switching material can be described by reference to FIG. 2. When no voltage is applied across the material, the material is in the "OFF" state and no current flows. This condition corresponds to the origin of the I-V plot shown in FIG. 2 (current=0, voltage=0). The threshold switching material remains in the OFF state as the voltage across the threshold switching material and the current through the threshold switching material is increased, up to a voltage $V_t$ which is referred to as the "threshold voltage" of the threshold switching material. When the voltage across the threshold switching material is less than $V_t$, the slope of the off-state branch of the I-V curve is small and the current flowing through the threshold switching material increases only in a small amount as the applied voltage is increased.

When the applied voltage across the threshold switching material equals or exceeds the threshold voltage $V_t$, the threshold switching material switches from the off-state branch 50 to the on-state branch 60 of the I-V curve. The switching event occurs instantaneously and is depicted by the dashed line in FIG. 2. Upon switching, the voltage across the threshold switching material decreases significantly and the current through the threshold switching material becomes much more sensitive to changes in the device voltage (hence, branch 60 is steeper than branch 50). The threshold switching material remains in the on-state branch 60 as long as a minimum current, labeled $I_h$ in FIG. 2, is maintained. $I_h$ is referred to as the holding current of the threshold switching material and the associated voltage $V_h$ is referred to as the holding voltage of the threshold switching material. If the threshold material conditions are changed so that the current becomes less than $I_h$, the threshold switching material normally returns to the off-state branch 50 of the I-V plot and requires re-application of a voltage which is greater than or equal to the threshold voltage $V_t$ to resume operation on the on-state branch. If the current is only momentarily (a time less than the recovery time of the chalcogenide material) reduced below $I_h$, the ON state of the memory element may be recovered upon restoring the current through the memory element which is at or above $I_h$.

Analogous switching behavior occurs in the third quadrant of the I-V plot shown in FIG. 2. Provided one is aware of the negative polarities of both the voltage and current of the I-V curve in the third quadrant, the switching behavior in the third quadrant is analogous to that described hereinabove for the first quadrant. For example, applied voltages having a magnitude greater than the magnitude of the negative threshold voltage in the third quadrant induce switching from the off-state branch 50 to the on-state branch 60.

It is noted that the current-voltage characteristic curve shown in FIG. 2 is an example of an "S-type" current-voltage characteristic curve. It is possible that any threshold switching material that exhibits similar S-type current-voltage characteristics may be used as the threshold switching material in the memory element of the present invention.

Hence, as described above, the threshold switching material may be switched from an OFF state to an ON state by application of a voltage across the memory element having a magnitude which is greater than or equal to the magnitude of the threshold voltage $V_t$. While not wishing to be bound by theory, it is believed that application of a voltage across the threshold switching material which is at or above the threshold voltage may cause the formation of a conductive channel or filament within the threshold switching material. At the threshold voltage $V_t$, the electric field experienced by the chalcogenide threshold switching material is sufficiently high to induce a breakdown or avalanche effect whereby electrons are removed from atoms to form a highly conductive, plasma-like filament of charge carriers. Rather than being bound to atoms, some electrons become unbound and highly mobile. As a result, a conductive channel or filament forms. The conductive filament constitutes a conductive volume within the otherwise resistive chalcogenide threshold switching material. The conductive filament extends through the chalcogenide threshold switching material and provides a low resistance pathway for electrical current. Portions of the chalcogenide material outside of the filament remain resistive. Since electric current traverses the path of least resistance, the presence of a conductive filament renders the chalcogenide material more conductive and establishes an "ON" state. The creation of a conductive filament is the event that underlies the switching of the threshold switching material from its OFF state to its ON state.

Referring again to FIG. 3, when a voltage is applied across the memory element 100 by the first and second electrodes 120, 160, a significant portion of the applied voltage appears across the threshold switching material 150. (As noted above, the memory material 130 is preferably deposited in its low resistance state so that the voltage drop across the memory material 130 is thus very small and most of the voltage drop occurs across threshold material 150).

Figure 4:
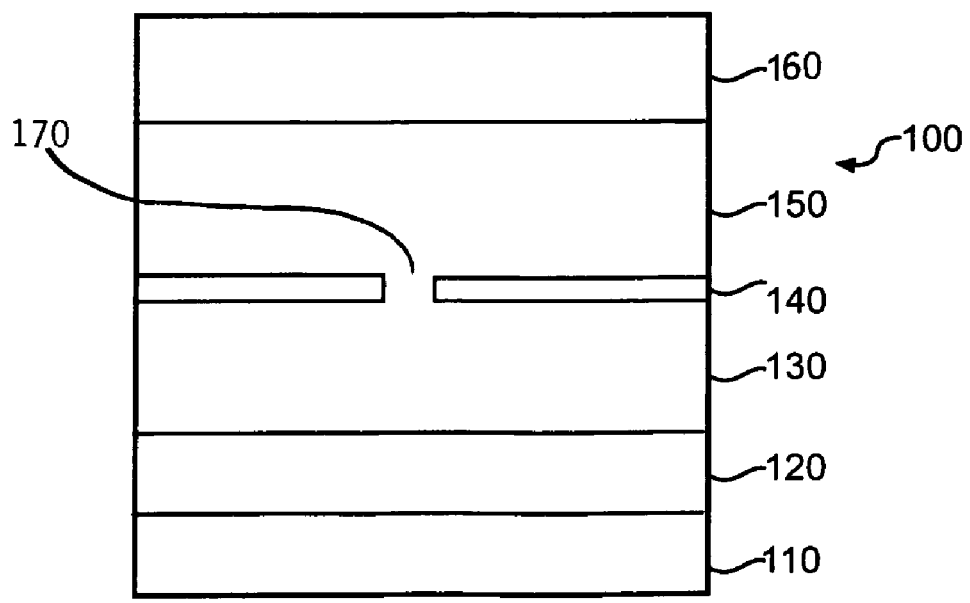
FIG. 4 is the embodiment of the memory element shown in FIG. 3 with a hole formed in the breakdown layer.

When the voltage across the threshold switching material 150 reaches the threshold voltage, the threshold switching material switches to its "ON" state and a conductive filament is created. While not wishing to be bound by theory, it is believed that the formation of the conductive filament, in turn, may cause a small region of the breakdown layer 140 to disintegrate so as to form a hole 170 through the breakdown layer 140 as shown in FIG. 4. The size of the hole (e.g., the diameter of the hole) may be defined by the electrical current applied to the memory element when forming the filament divided by the saturation current density in the conductive filament. Hence, the size of the hole may be controlled by the magnitude of the current applied when the hole is formed. Preferably, it is through this hole 170 that substantially all of the programming current of any subsequent memory cycling pulses (e.g., set and reset pulses) may pass. That is, when subsequent programming currents are applied to the memory element 100 (by the electrodes 120, 160), substantially all of these currents will preferably pass through the hole 170. Hence, the programming current density may be made to be relatively high in the portion of memory material 130 that is in the vicinity of the hole 170. The overall amount of programming current needed to program the memory element may thus be reduced. The use of a breakdown layer 140 between the memory material 130 and the threshold switching material 150 may thus serve to reduce the wasted current or leakage current of the memory element when the memory element is programmed.

Figure 5:
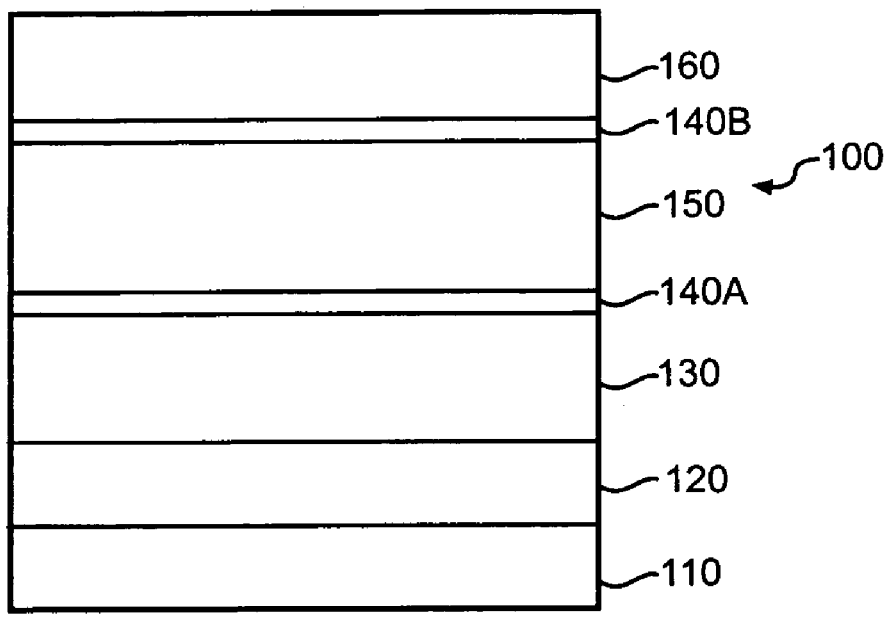
FIG. 5 is an embodiment of a memory element of the present invention including a first and a second breakdown layer.
Figure 6:
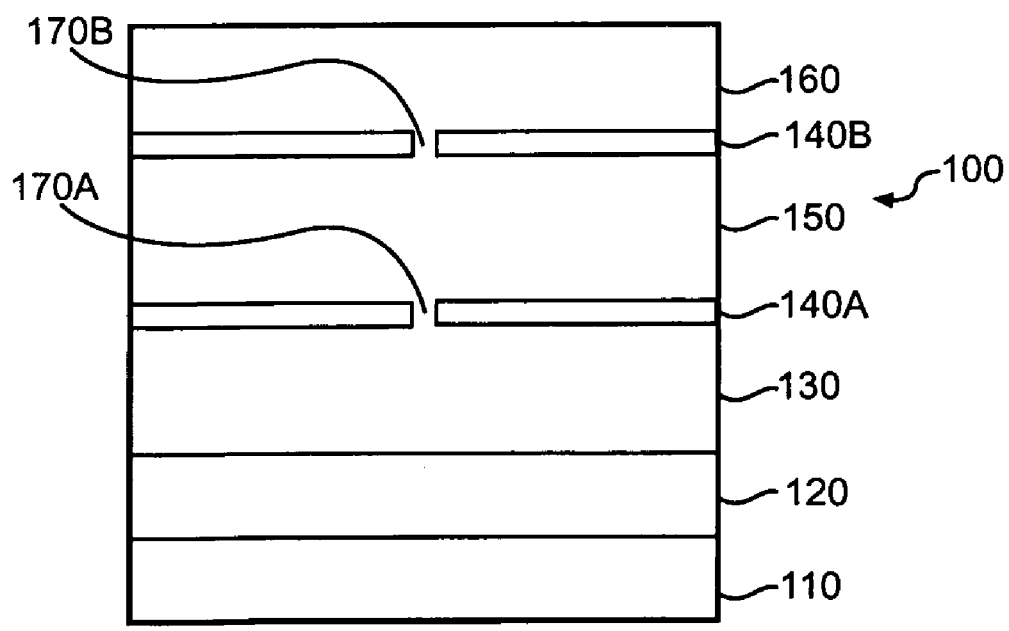
FIG. 6 is the embodiment of the memory element shown in FIG. 5 with holes formed in the first and second breakdown layers.

An alternate embodiment of a memory element of the present invention is shown in FIG. 5. In this case, a first breakdown layer 140A is disposed between the memory material 130 and the threshold switching material 150 while a second breakdown layer 140B is disposed between the threshold switching material 150 and the upper conductive layer 160. Each of the breakdown layers is preferably formed of a dielectric material. The dielectric material may be an oxide (such as a silicon oxide) or a nitride (such as a silicon nitride). The breakdown layers 140A, 140B may be formed of the same or different dielectric materials. Again, while not wishing to be bound by theory, it is believed that application of a sufficient voltage across the memory element 100 causes the threshold switching material 150 to switch into the "ON" state and a conductive filament to form. In addition, it is believed that the formation of the conductive filament may cause the disintegration of regions in both the first breakdown layer 140A and second breakdown layer 140B, thereby causing the formation of holes 170A and 170B in the first and second breakdown layers, respectively, as shown in FIG. 6. When a current is applied to the memory element 100, substantially all of this current preferably flows through the holes 170A and 170B. Because of the small size of the holes 170A and 170B, the current density may be very high in the portions of the memory material 130 and threshold switching material 150 that are in the vicinity of the holes 170A, 170B.

Figure 7:
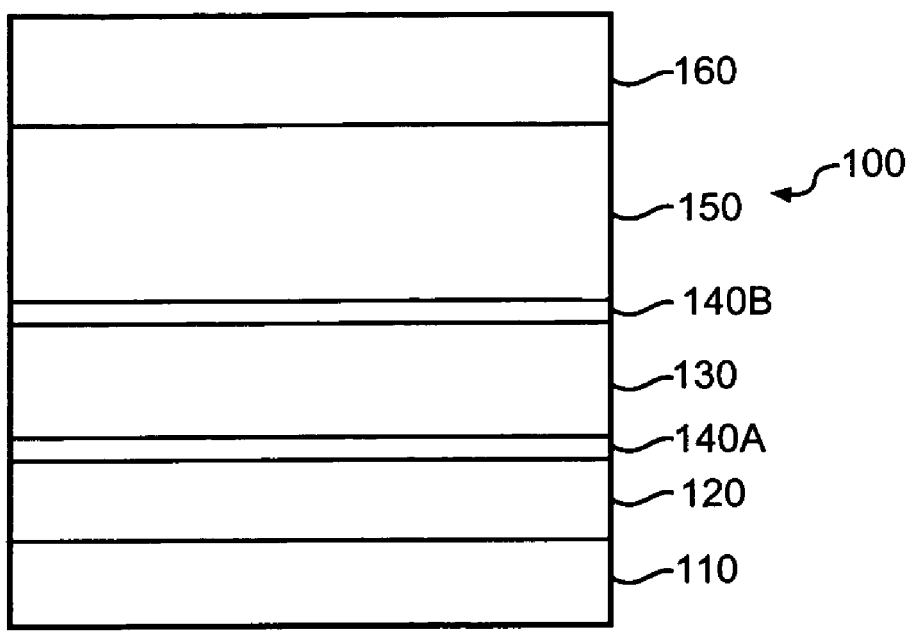
FIG. 7 is an embodiment of a memory element of the present invention including a first and a second breakdown layer.
Figure 8:
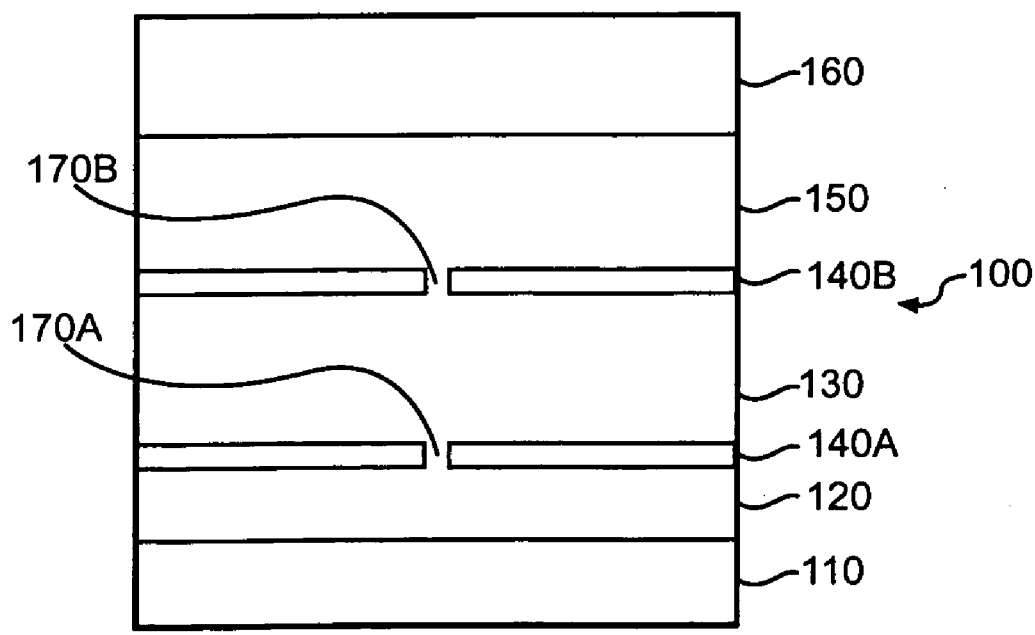
FIG. 8 is the embodiment of the memory element shown in FIG. 7 with holes formed in the first and second breakdown layers.

Another embodiment of a memory element of the present invention is shown in FIG. 7. In this embodiment a first breakdown layer 140A is disposed between first conductive layer 120 and memory material 130, and a second breakdown layer 140B is disposed between the memory material 130 and the threshold material 150. As described above, each of the breakdown layers 140A, 140B is preferably formed of a dielectric material (such as an oxide or a nitride). Again, while not wishing to be bound by theory, it is believed that application of the appropriate voltage across the memory element may cause the formation of hole 170A in the first breakdown layer 140A and the formation of hole 170B in the second breakdown layer 140B as shown in FIG. 8. When a programming current is applied to the memory element, it may be channeled through these holes.

Figure 9:
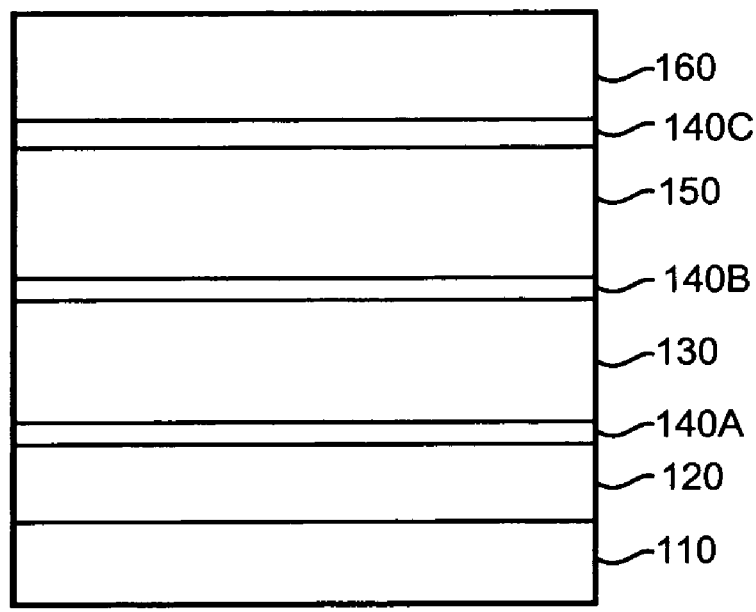
FIG. 9 is an embodiment of a memory element of the present invention includes a first, second and third breakdown layer.
Figure 10:
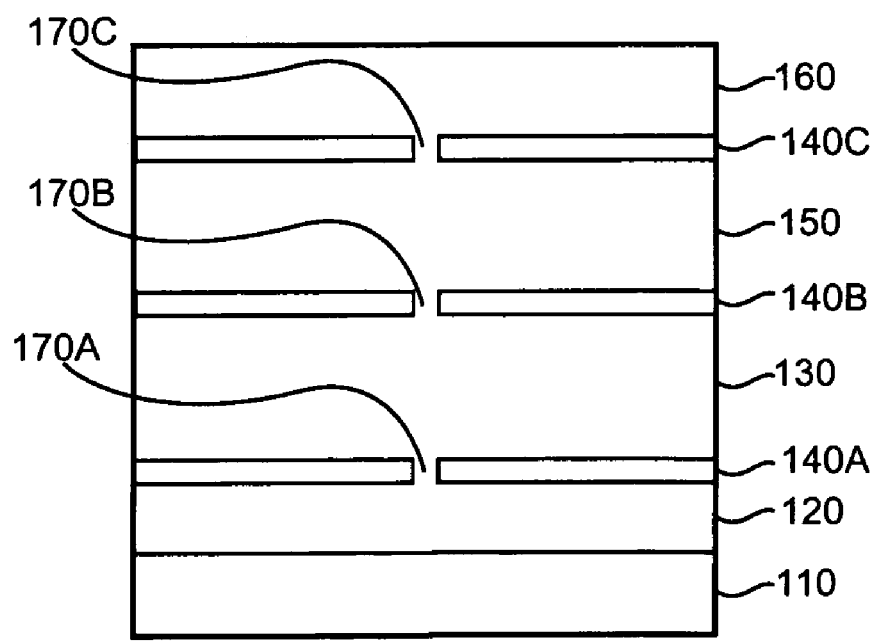
FIG. 10 is the embodiment of the memory element shown in FIG. 9 with holes formed in the first, second and third breakdown layers.

Yet another embodiment of the invention is shown in FIG. 9. In this embodiment a first breakdown layer 140A is disposed between the first conductive layer 120 and the memory material 130, a second breakdown layer 140B is disposed between the memory material 130 and the threshold switching material 150, and a third breakdown layer 140C is disposed between the threshold material 150 and the second conductive layer 160. Each of the breakdown layers may be formed of a dielectric material (such as an oxide or a nitride). Again, while not wishing to be bound by theory, it is believed that application of the appropriate voltage across the memory element may cause the formation of holes 170A, 170B and 170C in the breakdown layers 140A, 140B and 140C, respectively, as depicted in FIG. 10.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An electrically programmable memory comprising:
   a programmable resistance material;
   a threshold switching material comprising a chalcogen element; and
   a first layer of a dielectric material between said programmable resistance material and said threshold switching material, said dielectric material including silicon nitride.

2. The memory of claim 1, further comprising a second layer of a dielectric material, said threshold switching material being between said first layer and said second layer.

3. The memory of claim 2, further comprising a third layer of a dielectric material, said programmable resistance material being between said third layer and said first layer.

4. The memory of claim 1, further comprising a second layer of a dielectric material, said programmable resistance material being between said first layer and said second layer.

5. The memory of claim 1, wherein said programmable resistance material is a phase-change material.

6. The memory of claim 1, wherein said programmable resistance material comprises a chalcogen element.

7. The memory of claim 1, wherein said first layer has a thickness of less than 100 Angstroms.

* * * * *